US010122313B2

(12) United States Patent
Hara et al.

(10) Patent No.: US 10,122,313 B2
(45) Date of Patent: Nov. 6, 2018

(54) POWER CONVERSION DEVICE

(71) Applicant: Hitachi Automotive Systems, Ltd., Hitachinaka-shi, Ibaraki (JP)

(72) Inventors: Yosei Hara, Hltachinaka (JP); Morio Kuwano, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/528,014

(22) PCT Filed: Jan. 12, 2016

(86) PCT No.: PCT/JP2016/050605
§ 371 (c)(1),
(2) Date: May 18, 2017

(87) PCT Pub. No.: WO2016/117403
PCT Pub. Date: Jul. 28, 2016

(65) Prior Publication Data
US 2017/0331406 A1 Nov. 16, 2017

(30) Foreign Application Priority Data
Jan. 19, 2015 (JP) .................................. 2015-007356

(51) Int. Cl.
*H02P 23/00* (2016.01)
*H02P 27/06* (2006.01)
(Continued)

(52) U.S. Cl.
CPC .......... *H02P 27/06* (2013.01); *B60L 11/1803* (2013.01); *H01L 23/535* (2013.01); *H01L 29/0603* (2013.01); *H02M 7/48* (2013.01)

(58) Field of Classification Search
CPC ........... H01L 2224/48091; H01L 2924/19041; H02K 1/144; H02P 21/06; H02P 23/08
(Continued)

(56) References Cited

U.S. PATENT DOCUMENTS 5,966,291 A * 10/1999 Baumel .............. H05K 7/20927
  165/80.3
7,719,838 B2 * 5/2010 Nakajima ............. H02M 7/003
  165/104.33
(Continued)

FOREIGN PATENT DOCUMENTS

| JP | 2008-252962 A | 10/2008 |
|----|---------------|---------|
| JP | 2014-50118 A  | 3/2014  |
| JP | 2014-171343 A | 9/2014  |

OTHER PUBLICATIONS

International Search Report (PCT/ISA/210) issued in PCT Application No. PCT/JP2016/050605 dated Apr. 26, 2016 with English translation (3 pages).
(Continued)

*Primary Examiner* — Rina Duda
(74) *Attorney, Agent, or Firm* — Crowell & Moring LLP

(57) ABSTRACT

It is an object of the present invention to enhance connection reliability of terminals while enhancing assembling performance. A power conversion device according to the present invention includes: a power semiconductor module having a power terminal; a capacitor module for supplying smoothed power to the power semiconductor module; and a mold bus bar in which a conductor part for electrically connecting the power semiconductor module and the capacitor module is sealed by a resin material, wherein the capacitor module has a positive capacitor terminal and a negative capacitor terminal, the power terminal, the positive capacitor terminal, and the negative capacitor terminal are formed such that the main surfaces of the terminals face in the same direction,
(Continued)

and the mold bus bar has a first terminal contacting with the main surface of the power terminal, a second terminal contacting with the main surface of the positive capacitor terminal, and a third terminal contacting with the main surface of the negative capacitor terminal.

3 Claims, 7 Drawing Sheets

(51) Int. Cl.
*H02M 7/48* (2007.01)
*B60L 11/18* (2006.01)
*H01L 29/06* (2006.01)
*H01L 23/535* (2006.01)

(58) Field of Classification Search
USPC .................................. 318/798, 800, 801
See application file for complete search history.

(56) References Cited

U.S. PATENT DOCUMENTS

| | | | |
|---|---|---|---|
| 7,899,602 B2* | 3/2011 | Yoshinari | F02D 41/20 |
| | | | 123/490 |
| 7,965,510 B2* | 6/2011 | Suzuki | B60K 6/365 |
| | | | 165/80.4 |
| 7,978,471 B2* | 7/2011 | Tokuyama | H01L 23/36 |
| | | | 165/104.33 |
| 2011/0069455 A1* | 3/2011 | Tokuyama | H01L 23/473 |
| | | | 361/702 |
| 2015/0189784 A1 | 7/2015 | Hirano et al. | |

OTHER PUBLICATIONS

Japanese-language Written Opinion (PCT/ISA/237) issued in PCT Application No. PCT/JP2016/050605 dated Apr. 26, 2016 (5 pages).

* cited by examiner

POWER CONVERSION DEVICE

TECHNICAL FIELD

The present invention relates to a power conversion device, and particularly to a power conversion device for converting direct current into alternating current.

BACKGROUND ART

Higher power of a vehicle drive motor used in hybrid automobiles or electric automobiles is required, and accordingly a power conversion device is required to be for high power. An improvement in connection reliability of a conductor member connected to a power semiconductor module for power conversion and a capacitor module for power smoothing, which are provided in the power conversion device, is required for high power.

In PTL 1 (JP 2008-252962 A), a resin body 24 is connected to relay a terminal of a reactor 14 and a terminal of a capacitor 13.

CITATION LIST

Patent Literature

PTL 1: JP 2008-252962 A

SUMMARY OF INVENTION

Technical Problem

It is an object of the present invention to enhance connection reliability of terminals while enhancing assembling performance.

Solution to Problem

In order to solve the object, a power conversion device according to the present invention includes: a power semiconductor module (100) having a power terminal (101); a capacitor module (200) for supplying smoothed power to the power semiconductor module; and a mold bus bar (500) in which a conductor part for electrically connecting the power semiconductor module and the capacitor module (200) is sealed by a resin material, wherein the capacitor module has a positive capacitor terminal (203) and a negative capacitor terminal (204), the power terminal, the positive capacitor terminal, and the negative capacitor terminal are formed such that the main surfaces of the terminals face in the same direction, and the mold bus bar (500) has a first terminal (506) contacting with the main surface of the power terminal (101), a second terminal (512) contacting with the main surface of the positive capacitor terminal, and a third terminal (514) contacting with the main surface of the negative capacitor terminal.

Advantageous Effects of Invention

According to the present invention, it is possible to enhance connection reliability of terminals while enhancing assembling performance.

DESCRIPTION OF EMBODIMENTS

Figure 1:
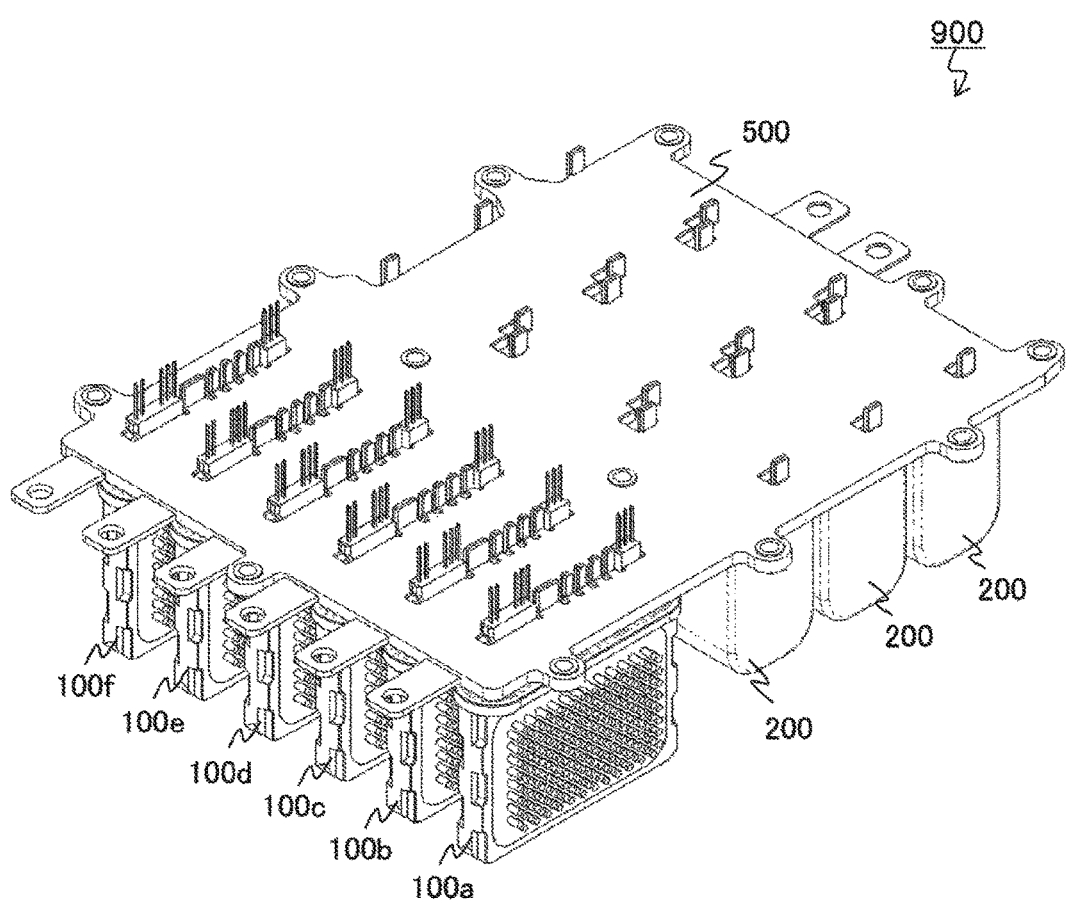
FIG. 1 is a perspective view of a main circuit part 900 in a power conversion device.

An embodiment of the present invention will be described below with reference to the drawings. Specific examples of the contents of the present invention will be explained in the following description, but the present invention is not limited to the description, and various changes and modifications can be made by those skilled in the art within the scope of the technical spirit disclosed in the specification. The same functions are denoted with the same reference numerals and a repeated description thereof may be omitted throughout the drawings for describing the present invention.

Figure 2:
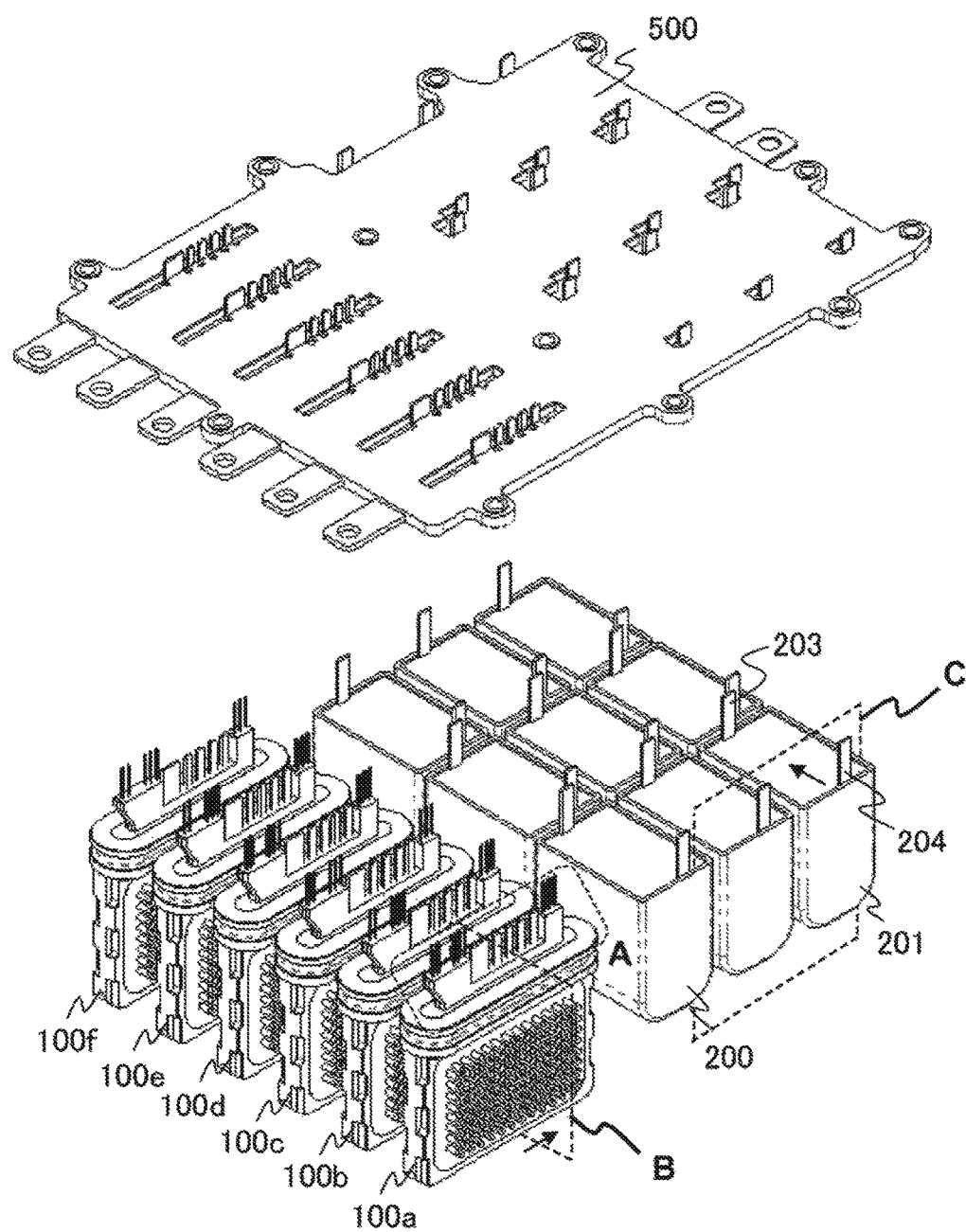
FIG. 2 is an exploded perspective view of the main circuit part 900 in the power conversion device.
Figure 3:
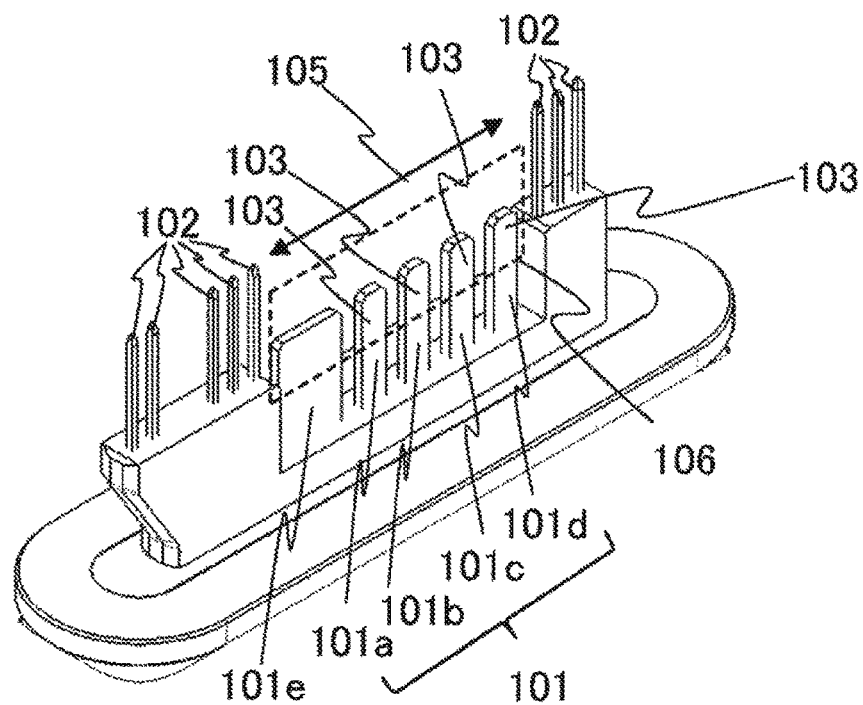
FIG. 3 is a partially enlarged view of a power terminal 101 and signal terminals 102 in a power semiconductor module 100a in range A illustrated in FIG. 2.
Figure 4:
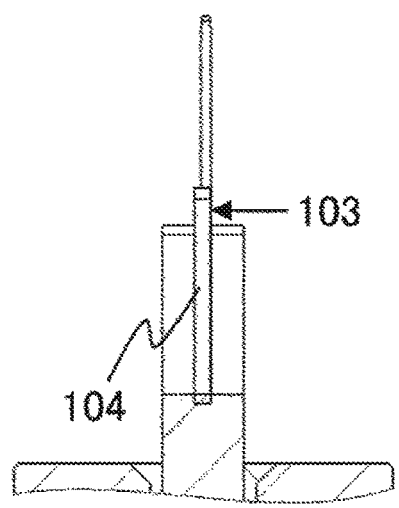
FIG. 4 is a cross-section view of the power semiconductor module 100a viewed in the arrow direction in plane B illustrated in FIG. 2.
Figure 5:
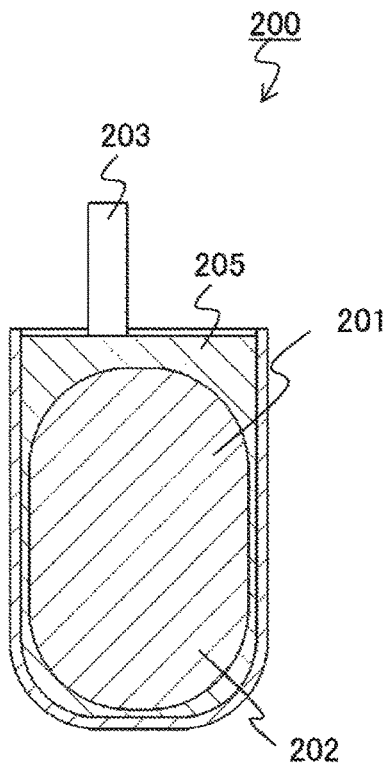
FIG. 5 is a cross-section view of a capacitor module 200 viewed in the arrow direction in plane C in FIG. 2.

FIG. 1 is a perspective view of a main circuit part 900 in a power conversion device. Herein, the main circuit part 900 receives DC power from a vehicle-mounted battery and outputs AC power to a vehicle drive motor. FIG. 2 is an exploded perspective view of the main circuit part 900 in the power conversion device. FIG. 3 is a partially enlarged view of a power terminal 101 and signal terminals 102 in a power semiconductor module 100a in range A illustrated in FIG. 2. FIG. 4 is a cross-section view of the power semiconductor module 100a viewed in the arrow direction in plane B illustrated in FIG. 2. FIG. 5 is a cross-section view of a capacitor module 200 viewed in the arrow direction in plane C in FIG. 2.

The power semiconductor modules 100a to 100f illustrated in FIG. 1 and FIG. 2 have inverter circuits for converting DC power into AC power. According to the present embodiment, the power semiconductor module 100a configures upper and lower arm circuits for outputting one phase in an inverter circuit for outputting 3-phase alternating current. For example, the power semiconductor module 100a is upper and lower arm circuits for U-phase, the power semiconductor module 100b is upper and lower arm circuits for V-phase, and the power semiconductor module 100c is upper and lower arm circuits for W-phase. The power semiconductor modules 100a to 100c then configure a first inverter circuit.

Similarly, the power semiconductor module 100d is upper and lower arm circuits for U-phase, the power semiconductor module 100e is upper and lower arm circuits for V-phase, and the power semiconductor module 100f is upper and lower arm circuits for W-phase. The power semiconductor modules 100d to 100f then configure a second inverter circuit. That is, according to the present embodiment, one power conversion device comprises two inverter circuits. The two inverter circuits may drive different motors, or may drive one motor.

The capacitor modules 200 illustrated in FIG. 1 and FIG. 2 smooth DC power supplied from the battery. A capacitor module 200 illustrated in FIG. 2 and FIG. 5 has a capacitor cell 201 like a film capacitor, for example, a positive capacitor terminal 203 and a negative capacitor terminal 204 for electrically connecting the capacitor cell 201 and a mold bus bar 500 described below, a capacitor case 202 for housing the capacitor cell 201 therein, and a sealing material 205 filled in the capacitor case 202.

The power terminal 101 illustrated in FIG. 3 receives DC power supplied from the capacitor modules 200.

The power terminal 101 as negative terminal is branched by a first negative power terminal 101a and a second negative power terminal 101c. The power terminal 101 as positive terminal is branched by a first positive power terminal 101b and a second positive power terminal 101d. Thereby, it is possible to prevent current flowing into the terminals from focusing and to achieve lower inductance. An AC terminal 101e transfers alternating current output to the vehicle drive motor, and is arranged next to the first negative power terminal 101a.

As illustrated in FIG. 3, a main surface 103 of the power terminal 101 overlaps on a virtual plane 106 substantially parallel with an arrangement direction 105 of the first negative power terminal 101a, the first positive power terminal 101b, the second negative power terminal 101c, and the second positive power terminal 101d.

As illustrated in FIG. 4, a side surface 104 of the power terminal 101 is formed to be substantially orthogonal to the virtual plane 106. In other words, the side surface 104 of the power terminal 101 overlaps on a plane crossing with the virtual plane 106.

Figure 6:
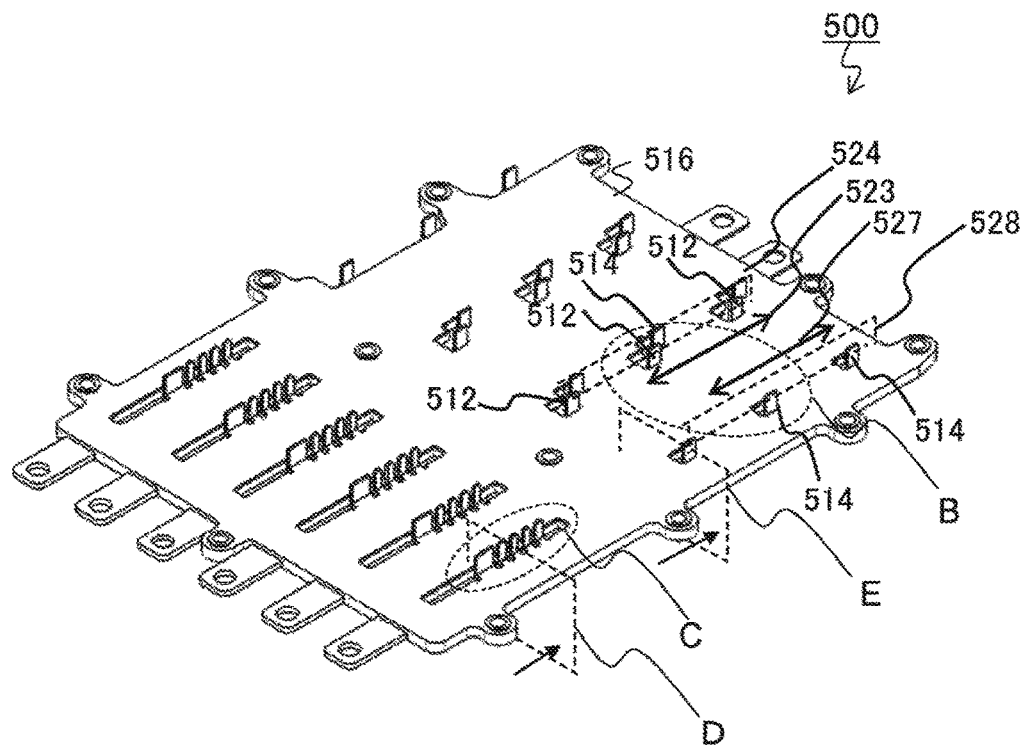
FIG. 6 is a perspective view of an entire mold bus bar 500.
Figure 7:
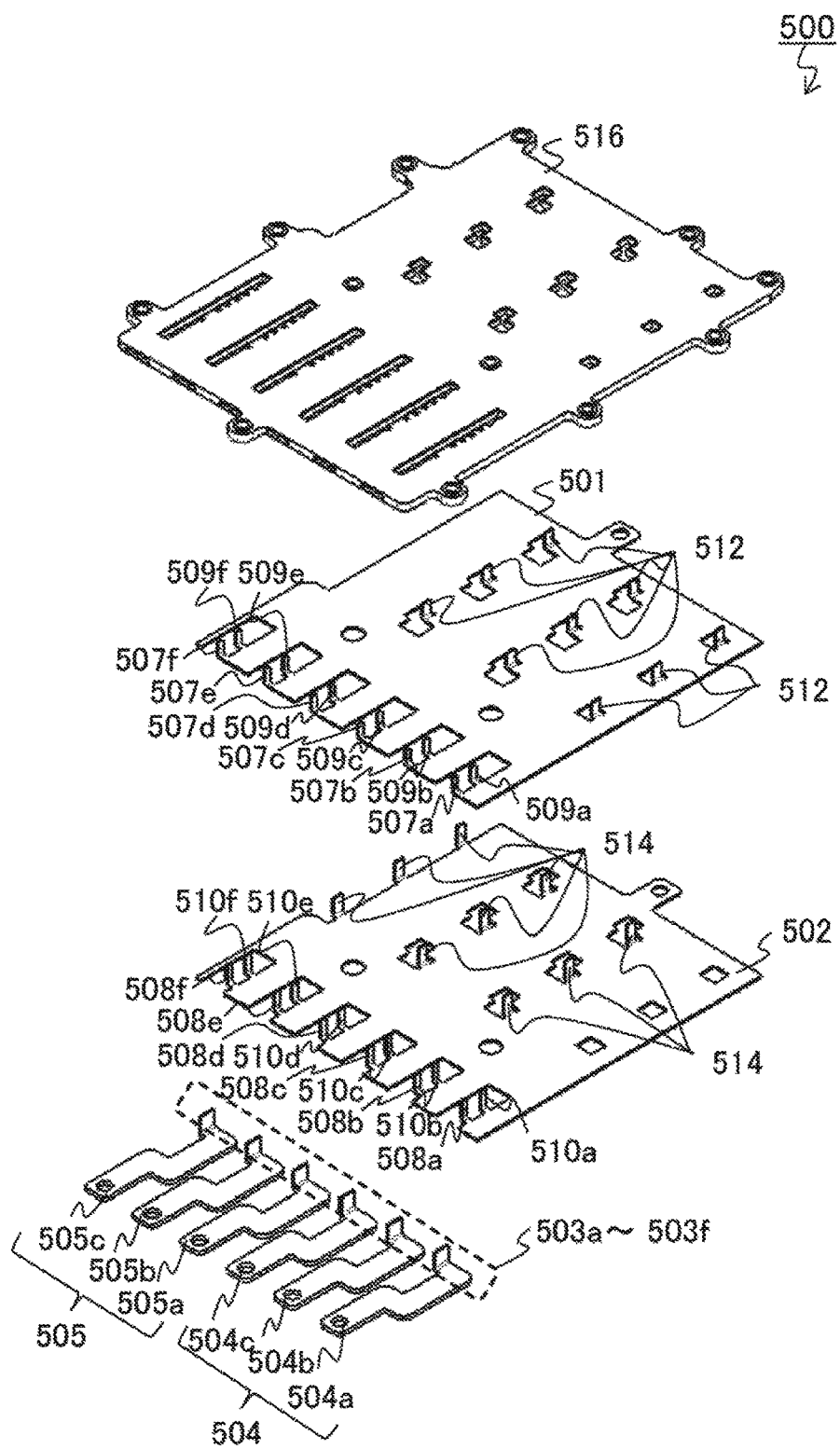
FIG. 7 is an exploded perspective view of the mold bus bar 500.
Figure 8:
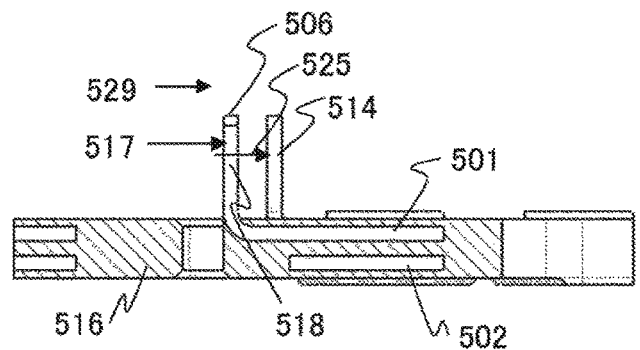
FIG. 8 is a cross-section view of the mold bus bar 500 viewed in the arrow direction in plane D illustrated in FIG. 6.
Figure 9:
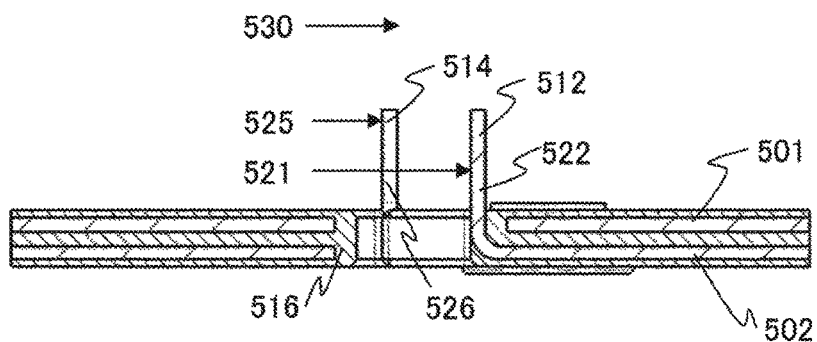
FIG. 9 is a cross-section view of the mold bus bar 500 viewed in the arrow direction in plane E illustrated in FIG. 6.
Figure 10:
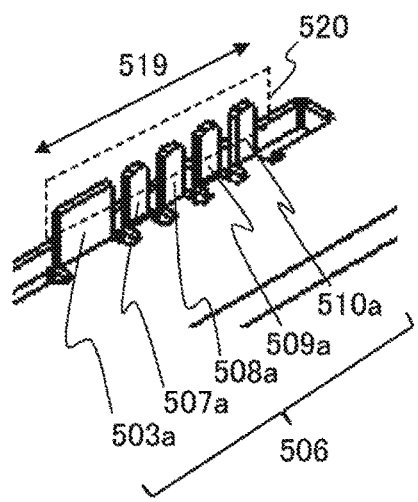
FIG. 10 is a partially enlarged view of a first terminal 506 in the mold bus bar 500 in range C illustrated in FIG. 6.
Figure 11:
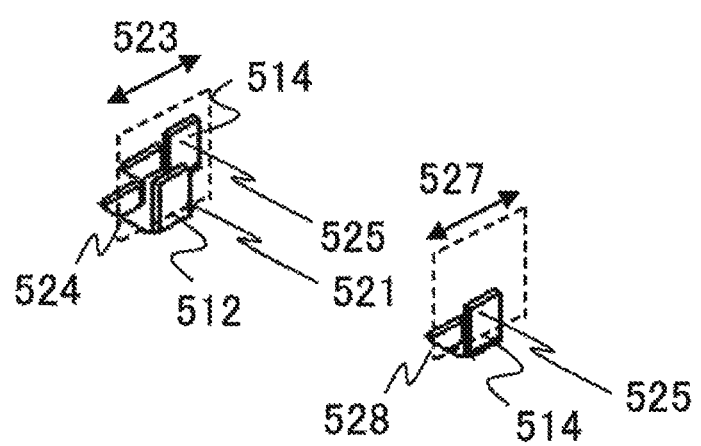
FIG. 11 is a partially enlarged view of a second terminal 512 and a third terminal 514 in the mold bus bar 500 in range B in FIG. 6.

FIG. 6 is a perspective view of the entire mold bus bar 500. FIG. 7 is an exploded perspective view of the mold bus bar 500. FIG. 8 is a cross-section view of the mold bus bar 500 viewed in the arrow direction in plane D illustrated in FIG. 6. FIG. 9 is a cross-section view of the mold bus bar 500 viewed in the arrow diction in plane E illustrated in FIG. 6. FIG. 10 is a partially enlarged view of a first terminal 506 in the mold bus bar 500 in range C illustrated in FIG. 6. FIG. 11 is a partially enlarged view of a second terminal 512 and a third terminal 514 in the mold bus bar 500 in range B in FIG. 6.

As illustrated in FIG. 8, the mold bus bar 500 is configured of a negative conductor plate 501, a positive conductor plate 502, a resin material 516, an AC bus bar 504, and an AC bus bar 505.

As illustrated in FIG. 7 and FIG. 8, the negative conductor plate 501 is arranged to be stacked on the positive conductor plate 502 such that a main surface of the negative conductor plate 501 opposes a main surface of the positive conductor plate 502.

The AC bus bar 504 illustrated in FIG. 7 is configured of an AC bus bar 504a connected to the power semiconductor module 100a, an AC bus bar 504b connected to the power semiconductor module 100b, and an AC bus bar 504c connected to the power semiconductor module 100c.

The AC bus bar 505 illustrated in FIG. 7 is configured of an AC bus bar 505a connected to the power semiconductor module 100d, an AC bus bar 505b connected to the power semiconductor module 100e, and an AC bus bar 505c connected to the power semiconductor module 100f.

As illustrated in FIG. 7 and FIG. 8, the resin material 516 seals part of each of the positive conductor plate 502, the negative conductor plate 501, the AC bus bar 504, and the AC bus bar 505. Further, the resin material 516 is inserted between the main surface of the negative conductor plate 501 and the main surface of the positive conductor plate 502 thereby to keep the negative conductor plate 501 and the positive conductor plate 502 insulated from each other.

The mold bus bar 500 according to the present embodiment has an integrated structure in which the AC bus bar 504 and the AC bus bar 505 are shaped together in addition to the negative conductor plate 501 and the positive conductor plate 502 and are sealed by the resin material 516. Thereby, the mold bus bar 500 is formed as one part with strong electric wiring sealed by the resin material 516, and an enhancement in assembling can be expected.

As illustrated in FIG. 7 and FIG. 10, the first terminal 506 is configured of first negative conductor terminals 507a to 507f, first positive conductor terminals 508a to 508f, second negative conductor terminals 509a to 509f, second positive conductor terminals 510a to 510f, and AC conductor terminals 503a to 503f.

The first negative conductor terminals 507a to 507f and the second negative conductor terminals 509a to 509f are branched from the negative conductor plate 501, and current is distributed thereto. The first positive conductor terminals 508a to 508f and the second positive conductor terminals 510a to 510f are branched from the positive conductor plate 502, and current is distributed thereto.

The first negative conductor terminal 507a is connected to the first negative power terminal 101a of the power semiconductor module 100a, the first positive conductor terminal 508a is connected to the first positive power terminal 101b of the power semiconductor module 100a, the second negative conductor terminal 509a is connected to the second negative power terminal 101c of the power semiconductor module 100a, the second positive conductor terminal 510a is connected to the second positive power terminal 101d of the power semiconductor module 100a, and the AC conductor terminal 503a is connected to the AC terminal 101e of the power semiconductor module 100a. Other terminals of the mold bus bar 500 are similarly connected to the terminals of the power semiconductor modules 100b to 100f.

Further, the first terminal 506 is such that the second negative conductor terminals 509a to 509f are arranged between the first positive conductor terminals 508a to 508f and the second positive conductor terminals 510a to 510f.

As illustrated in FIG. 8 and FIG. 10, the first negative conductor terminal 507a, the first positive conductor terminal 508a, the second negative conductor terminal 509a, the second positive conductor terminal 510a, and the AC conductor terminal 503a are formed such that their main surfaces face in the same direction. Here, the main surfaces are connected to the terminals of the power semiconductor modules 100b to 100f, respectively. That is, a main surface 517 of the first terminal 506 is formed to face in the same direction. A side surface 518 of the first terminal 506 is formed to be transverse to the main surface 517.

As illustrated in FIG. 7, the second terminal 512 according to the present embodiment is configured of nine negative conductor terminals connected to the negative capacitor terminals 204, respectively. Further, the third terminal 514 according to the present embodiment is configured of nine positive conductor terminals connected to the positive capacitor terminals 203, respectively.

As illustrated in FIG. 9 and FIG. 11, the second terminals 512 and the third terminals 514 are formed such that a main surface 521 of a second terminal 512 and a main surface 525 of a third terminal 514 face in the same direction. The main surfaces 521 are connected to the negative capacitor terminals 204, and the main surfaces 525 are connected to the positive capacitor terminals 203. A side surface 522 of the second terminal 512 is formed to be transverse to the main surface 521. A side surface 526 of the third terminal 514 is formed to be transverse to the main surface 521.

Further, as illustrated in FIG. 7, the third terminals 514 are formed such that the main surfaces 525 of the third terminals 514 and the main surface 517 of the first terminal 506 face in the same direction. Thus, the first terminal 506, the second terminals 512, and the third terminals 514 are formed such that the main surface 517 of the first terminal 506, the main surfaces 521 of the second terminals 512, and the main surfaces 525 of the third terminals 514 face in the same direction.

As illustrated in FIG. 1 and FIG. 2, the power semiconductor modules 100a to 100f are arranged such that the power terminals 101 face the main surface 517 of the first terminal 506. Further, the capacitor modules 200 are arranged such that the positive capacitor terminals 203 face the main surfaces 521 of the second terminals 512 and the negative capacitor terminals 204 face the main surfaces 525 of the third terminals 514.

When the mold bus bar 500 is adjusted in position to the power semiconductor modules 100a to 100f and the capacitor modules 200, any of the main surface 517 of the first terminal 506, the main surfaces 521 of the second terminals 512, and the main surfaces 525 of the third terminals 514 contacts with the power terminals 101, the positive capacitor terminals 203, or the negative capacitor terminals 204, and the position of the mold bus bar 500 is corrected around the contact positions thereby to bring other terminals into contact.

Due to the positional correction of the mold bus bar 500 which comprises the first terminal 506, the second terminals 512, and the third terminals 514 and is formed as one part by the resin material 516, the terminals including the power terminals 101, the positive capacitor terminals 203, and the negative capacitor terminals 204, which require large current, can reduce variation in junctions to the mold bus bar 500 and can achieve easy assembling. The junctions are welding, clip connection, and the like.

Particularly according to the present embodiment, each of the power terminals 101 of the power semiconductor modules 100a to 100f is configured of the first negative power terminal 101a, the first positive power terminal 101b, the second negative power terminal 101c, and the second positive power terminal 101d, and the main surfaces of the terminals face in the same direction in order to achieve lower inductance. When the number of terminals increases, positional correction is difficult depending on the terminals. According to the present embodiment, however, a plurality of first terminals 506 of the mold bus bar 500 are provided depending on the power terminals 101, and the main surfaces 517 of the first terminals 506 face in the same direction, thereby reducing variation in junctions and achieving easy assembling while achieving lower inductance.

Even if one power terminal 101 of the power semiconductor modules 100a to 100f is present on the positive and negative sides, respectively, the technical spirit according to the present embodiment is applicable. Further, even if two power terminals 101 are present on the positive side and one is present on the negative side, or one is present on the positive side and two are present on the negative side, the technical spirit according to the present embodiment is applicable.

Further, as illustrated in FIG. 8 and FIG. 10, the main surfaces 517 of the respective terminals configuring the first terminal 506 overlap on a virtual plane 520 substantially parallel with an arrangement direction 519 of the first negative conductor terminal 507a, the first positive conductor terminal 508a, the second negative conductor terminal 509a, and the second positive conductor terminal 510a. Thereby, it is possible to further reduce variation in junctions and to achieve easy assembling while achieving lower inductance.

As illustrated in FIG. 6 and FIG. 11, the main surfaces 521 of the second terminals 512 overlap on a virtual plane 524 substantially parallel with an arrangement direction 523 of the second terminals 512. Similarly, the main surfaces 525 of the third terminals 514 overlap on a virtual plane 528 substantially parallel with an arrangement direction 527 of the third terminals 514. Thereby, it is possible to further reduce variation in junctions and to achieve easy assembling.

Further, according to the present embodiment, the mold bus bar 500 holds the AC bus bar 504 and the AC bus bar 505 by the resin material 516. The main surfaces of the AC conductor terminals 503a to 503f are formed to face in the same direction as the main surface 517 of the first terminal 506, and are connected to the AC terminal 101e of the power semiconductor module 100a. Thereby, it is possible to further reduce variation in junctions of the main circuit systems and to achieve easy assembling.

529 in FIG. 8 indicates an orientation in which the main surface 517 of the first terminal 506 opposes the main surface 103 of the power terminal 101 of the power semiconductor module 100a, and also indicates a direction in which the mold bus bar 500 moves when the power semiconductor module 100a and the mold bus bar 500 are connected to each other. 530 in FIG. 9 is an orientation in which the main surfaces 521 of the second terminals 512 oppose the main surfaces of the negative capacitor terminals 204, and also indicates a direction in which the mold bus bar 500 moves when the capacitor modules 200 and the mold bus bar 500 are connected to each other.

REFERENCE SIGNS LIST 100a to 100f . . . Power semiconductor module, 101 . . . Power terminal, 101a . . . First negative power terminal, 101b . . . First positive power terminal, 101c . . . Second negative power terminal, 101d . . . Second positive power terminal, 101e . . . AC terminal, 102 . . . Signal terminal, 103 . . . Main surface, 104 . . . Side surface, 105 . . . Arrangement direction, 106 . . . Virtual plane, 200 . . . Capacitor module, 201 . . . Capacitor cell, 202 . . . Capacitor case, 203 . . . Positive capacitor terminal, 204 . . . Negative capacitor terminal, 205 . . . Sealing material, 500 . . . Mold bus bar, 501 . . . Negative conductor plate, 502 . . . Positive conductor plate, 503a to 503f . . . AC conductor terminal, 504 . . . AC bus bar, 505 . . . AC bus bar, 504a to 504c . . . AC bus bar, 505a to 505c . . . AC bus bar, 506 . . . First terminal, 507a to 507f . . . First negative conductor terminal, 508a to 508f . . . First positive conductor terminal, 509a to 509f . . . Second negative conductor terminal, 510a to 510f . . . Second positive conductor terminal, 512 . . . Second terminal, 514 . . . Third terminal, 516 . . . Resin material, 517 . . . Main surface, 518 . . . Side surface, 519 . . . Arrangement direction, 520 . . . Virtual plane, 521 . . . Main surface, 522 . . . Side surface, 523 . . . Arrangement direction, 524 . . . Virtual plane, 525 . . . Main surface, 526 . . . Side surface, 527 . . . Arrangement direction, 528 . . . Virtual plane, 529 . . . Opposite direction, 530 . . . Opposite direction, 900 . . . Main circuit part

The invention claimed is:

1. A power conversion device comprising:
a power semiconductor module having a power terminal;
a capacitor module for supplying smoothed power to the power semiconductor module; and
a mold bus bar in which a conductor part for electrically connecting the power semiconductor module and the capacitor module is sealed by a resin material,
wherein the capacitor module has a positive capacitor terminal and a negative capacitor terminal,
the power terminal, the positive capacitor terminal, and the negative capacitor terminal are formed such that the main surfaces of the terminals face in the same direction,
the mold bus bar has a first terminal contacting with the main surface of the power terminal, a second terminal contacting with the main surface of the positive capacitor terminal, and a third terminal contacting with the main surface of the negative capacitor terminal,
wherein the power terminal is configured of a first positive power terminal, a first negative power terminal, a second positive power terminal, and a second negative power terminal, and is formed such that the main surfaces of the terminals face in the same direction,
the first terminal is configured of a first positive conductor terminal connected to the first positive power terminal, a first negative conductor terminal connected to the first negative power terminal, a second positive conductor terminal connected to the second positive power terminal, and a second negative conductor terminal connected to the second negative power terminal, and is formed such that the main surfaces of the terminals face in the same direction, and
wherein the main surface of the first positive conductor terminal, the main surface of the first negative conductor terminal, the main surface of the second positive conductor terminal, and the main surface of the second negative conductor terminal overlap on an imaginary plane that is parallel with an arrangement direction of the first positive conductor terminal, the first negative conductor terminal, the second positive conductor terminal, and the second negative conductor terminal.

2. The power conversion device according to claim 1, further comprising at least one more positive capacitor terminal, wherein
the positive capacitor terminals are structurally configured such that the main surfaces of the positive capacitor terminals overlap on the imaginary plane with the positive capacitor terminals.

3. The power conversion device according to claim 2, further comprising at least one more negative capacitor terminal, wherein
the negative capacitor terminals are structurally configured such that the main surfaces of the negative capacitor terminals overlap on the imaginary plane with the negative capacitor terminals.

* * * * *